(12) United States Patent
Zhu

(10) Patent No.: US 11,821,926 B2
(45) Date of Patent: Nov. 21, 2023

(54) VOLTAGE FLUCTUATION DETECTION CIRCUIT

(71) Applicant: Hypower Microelectronics (Wuxi) Co., Ltd., Wuxi (CN)

(72) Inventor: Ning Zhu, Wuxi (CN)

(73) Assignee: Hypower Microelectronics (Wuxi) Co., Ltd., Wuxi (CN)

( * ) Notice: Subject to any disclaimer, the term of this patent is extended or adjusted under 35 U.S.C. 154(b) by 82 days.

(21) Appl. No.: 17/486,769

(22) Filed: Sep. 27, 2021

(65) Prior Publication Data

US 2022/0404400 A1  Dec. 22, 2022

(30) Foreign Application Priority Data

Jun. 22, 2021  (CN) .......................... 202110690539.4

(51) Int. Cl.
*G01R 19/165*  (2006.01)
(52) U.S. Cl.
CPC ................................. *G01R 19/165* (2013.01)
(58) Field of Classification Search
CPC ......... G01R 19/0038–0053; G01R 19/25–257; G01R 19/165–17; H03K 5/24; G06F 1/10; G05F 1/46
See application file for complete search history.

(56) References Cited

U.S. PATENT DOCUMENTS

| | | | | |
|---|---|---|---|---|
| 6,873,201 B2* | 3/2005 | Panhofer | .............. | H03K 17/166 |
| | | | | 327/434 |
| 8,502,510 B2* | 8/2013 | Sheng | ................... | H02M 3/156 |
| | | | | 323/284 |
| 9,113,521 B2* | 8/2015 | Gredler | .................. | H05B 47/24 |
| 10,411,685 B2* | 9/2019 | Wong | .................. | H03K 5/1536 |
| 2018/0143659 A1* | 5/2018 | Wulff | ...................... | G05F 3/242 |

* cited by examiner

*Primary Examiner* — Feba Pothen
*Assistant Examiner* — James Split
(74) *Attorney, Agent, or Firm* — FIDELI LAW PLLC

(57) ABSTRACT

The present disclosure provides a voltage fluctuation detection circuit, which includes a voltage adjustment circuit and a comparator. The voltage adjustment circuit includes an adjustment circuit input terminal to receive the operating voltage, a first adjustment circuit output terminal to output a first voltage, and a second adjustment circuit output terminal to output a second voltage that is step-shaped, the second voltage differs from the first voltage by a bias voltage at the beginning of a preset clock period and falls within a first amplitude within the preset clock period, the magnitude of the bias voltage is related to the first voltage. The comparator includes: a first comparator input terminal to receive the first voltage, a second comparator input terminal to receive the second voltage, and a comparator output terminal to output a comparison result of the first voltage and the second voltage.

12 Claims, 9 Drawing Sheets

VOLTAGE FLUCTUATION DETECTION CIRCUIT

RELATED APPLICATION

The present application claims the benefit of priority to the Chinese patent application No. 202110690539.4, filed on Jun. 22, 2021, and entitled "Voltage Fluctuation Detection Circuit," the entire content of which is incorporated herein by reference.

TECHNICAL FIELD

The present disclosure relates to the technical field of integrated circuits (ICs), and in particular to a voltage fluctuation detection circuit.

BACKGROUND

In some cases, a specially designed circuit is required in an integrated circuit (IC) to detect the fluctuation of an electrical signal. For example, in some applications, it is necessary to detect the voltage of an input signal so as to determine whether the input signal is an alternating current (AC) signal or a direct current (DC) signal. The circuit needs to have high detection accuracy to ensure the performance of the IC, and it cannot be too complicated in order to reduce the cost and volume of the IC.

BRIEF SUMMARY

In order to solve the above-mentioned problems, the present disclosure provides a voltage fluctuation detection circuit. The voltage fluctuation detection circuit can detect the fluctuation of an electrical signal, and achieve a balance between circuit complexity, detection accuracy and sufficiently fast detection speed, thereby achieving a balance between the optimal performance and cost of an integrated circuit (IC).

The AC/DC voltage detection circuit includes:

BRIEF DESCRIPTION OF THE DRAWINGS

The present disclosure will be further described based on exemplary embodiments. The above and other aspects of the embodiments of the present disclosure will become clearer in the following detailed description when read with reference to the drawings.

DETAILED DESCRIPTION

The terms used herein are merely intended to describe specific examples or embodiments, rather than to limit the present disclosure. For example, unless contexts explicitly state otherwise, the singular forms "a", "an" and "the" used herein may also include plural forms. In this disclosure, the terms "include" and/or "comprise" refer to the existence of an associated integer, step, operation, element, component and/or group, without excluding the existence of one or more other features, integers, steps, operations, elements, components and/or groups. In other words, other features, integers, steps, operations, elements, components and/or groups may be added to the system/method. In this disclosure, the term "A is on B" may mean that A is directly adjacent to B (above or below), or that A and B are indirectly adjacent (that is, A and B are separated by an object). The term "A is in B" may mean that A is completely in B or A is partially in B.

In the following description of the present disclosure, the economical efficiency of the features, the operation and function of related elements of the structure, as well as the combination and manufacturing of the components can be significantly improved. All of these aspects form part of the present disclosure with reference to the drawings. However, it should be understood that the drawings are merely intended for illustration purposes, rather than to limit the scope of the present disclosure.

In some cases, IC needs a specially designed circuit(s) to detect the fluctuation of electrical signal.

The present disclosure provides a voltage fluctuation detection circuit. The voltage fluctuation detection circuit can detect the fluctuation of the electrical signal. The voltage fluctuation detection circuit provided by the present disclosure can achieve a balance between circuit complexity and detection speed, and achieve the balance between optimal performance and IC cost. The voltage fluctuation detection circuit provided in this disclosure can be applied to all ICs for detecting the characteristics of electrical signals.

Figure 1:
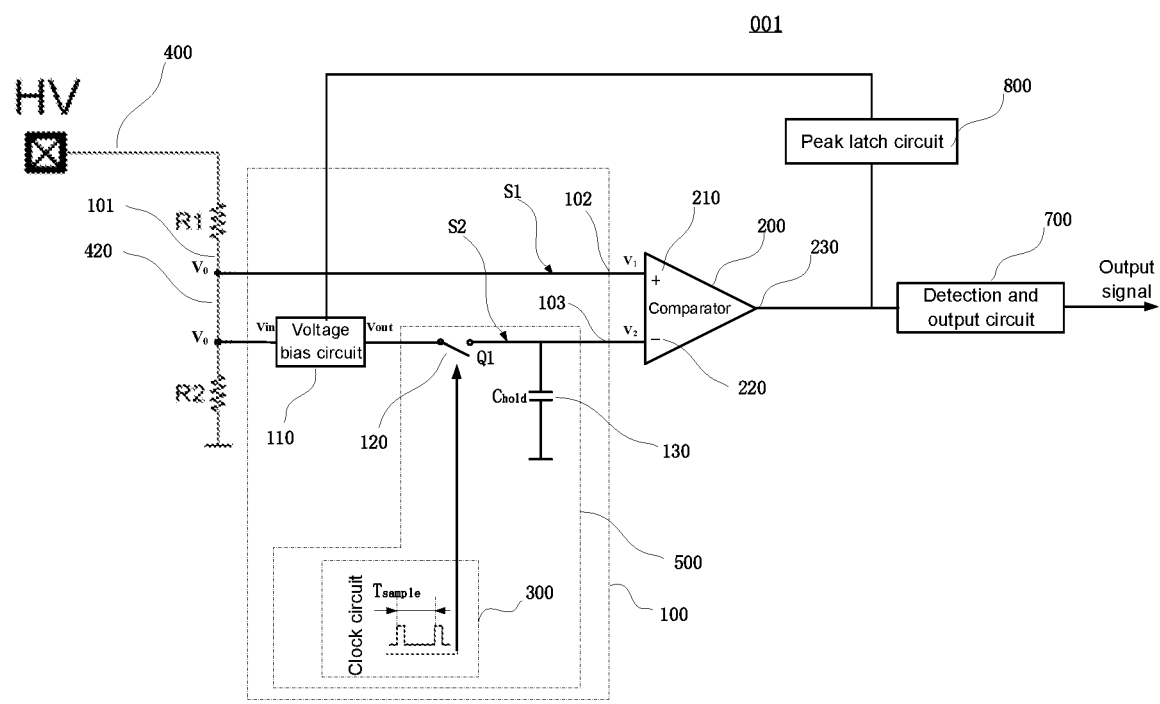
FIG. 1 illustrates a structure of a voltage fluctuation detection circuit according to some exemplary embodiments of the present disclosure.
Figure 2:
FIG. 2 illustrates a timing diagram of various signals of a voltage fluctuation detection circuit in operation according to some exemplary embodiments of the present disclosure.

As an example, FIG. 1 illustrates a structure of a voltage fluctuation detection circuit 001 according to some exemplary embodiments of the present disclosure. As an example, FIG. 2 illustrates a timing diagram of various signals of the fluctuation voltage detection circuit in operation according to some exemplary embodiments of the present disclosure. Specifically, the voltage fluctuation detection circuit 001 may include a voltage adjustment circuit 100 and a comparator 200. In some exemplary embodiments, the voltage fluctuation detection circuit 001 may further include a voltage divider circuit 400, a peak latch circuit 800 and/or a detection and output circuit 700.

The voltage divider circuit 400 may include any circuit for dividing a voltage signal $V_{HV}$ input through a high voltage (HV) pin into an operating voltage signal $V_0$. For example, as shown in FIG. 1, the voltage divider circuit 400 may include a first resistor $R_1$ and a second resistor $R_2$ connected in series. An output terminal (e.g., output port) 420 of the voltage divider circuit 400 may be connected between the first resistor $R_1$ and the second resistor $R_2$. One terminal (e.g., port) of the voltage divider circuit 400 may be connected to the voltage input HV pin, and the other terminal thereof may be connected to a ground wire GND. In this way, by reasonably designing the resistance of the first resistor $R_1$ and the second resistor $R_2$, the voltage divider circuit 400 may divide the input voltage signal $V_{HV}$ into the operating voltage signal $V_0$ at the output terminal 420.

The operating voltage signal $V_0$ may be an AC signal or a DC signal. For ease of description, in the following description of the present disclosure, the working mechanism of the voltage fluctuation detection circuit 001 will be described by taking an AC voltage signal as the operating voltage signal. Referring to FIG. 2, the operating voltage signal $V_0$ includes multiple periods, where the operating voltage signal in each period includes one rising edge and one falling edge.

The comparator 200 includes a first comparator input terminal 210, a second comparator input terminal 220 and a comparator output terminal 230. One of the first comparator input terminal 210 and the second comparator input terminal 220 may be a positive terminal (an input terminal marked with "+") of the comparator 200, and the other may be a negative terminal (an input terminal marked with "−") of the comparator 200. When the voltage of the positive terminal is higher than that of the negative terminal, the comparator output terminal comparator output terminal 230 of the comparator 200 outputs a high level. When the voltage of the negative terminal is higher than that of the positive terminal, the comparator output terminal comparator output terminal 230 of the comparator 200 outputs a low level. Taking FIG. 1 as an example, the first comparator input terminal 210 of the comparator may be electrically connected to a first output terminal 102 of the voltage adjustment circuit to receive a first voltage $V_1$. The second comparator input terminal 220 of the comparator may be electrically connected to a second output terminal 103 of the voltage adjustment circuit to receive a second voltage $V_2$. The comparator 200 may compare the magnitudes of the first voltage signal $V_1$ and the second voltage signal $V_2$, and output a high level or a low level via the comparator output terminal 230 according to a comparison result, that is, to output the comparison result between the first voltage $V_1$ and the second voltage $V_2$. When the first voltage signal $V_1$ is higher than the second voltage signal $V_2$, the comparator outputs a high level. When the first voltage signal $V_1$ is lower than the second voltage signal $V_2$, the comparator outputs a low level.

The detection and output circuit 700 is connected to the comparator output terminal 230. The detection and output circuit 700 detects the comparison result output by the comparator output terminal 230, and outputs a control signal based on the comparison result. The control signal may be used to control the start or stop of an integrated circuit (IC). The detection and output circuit 700 may also output a characteristic of the input signal based on the comparison result, for example, to indicate whether the type of the input signal is AC or DC. As an example, the detection and output circuit 700 may include at least one counting circuit. As an example, the counting circuit may include one or more counters for determining whether the type of the input signal is AC or DC by counting the number of flips of the output of the comparator between high and low levels.

One terminal of the peak latch circuit 800 may be connected to the comparator output terminal 230 of the comparator 200 and the other terminal thereof is connected to a voltage bias circuit 110. The peak latch circuit 800 records and latches peak data of the $V_{HV}$ according to the output signal of the comparator output terminal 230 of the comparator, and transfers the peak data to the voltage bias circuit 110. The voltage bias circuit 110 automatically adjusts the magnitude of a bias voltage according to the peak data.

The voltage adjustment circuit 100 may include an input terminal 101, the first output terminal 102 and the second output terminal 103. The input terminal 101 of the voltage adjustment circuit receives the operating voltage $V_0$. The first output terminal 102 of the voltage adjustment circuit outputs the first voltage $V_1$. The second output terminal 103 of the voltage adjustment circuit outputs the second voltage $V_2$ that is a step-shaped voltage. As an example, the second voltage $V_2$ is different from the first voltage $V_1$ by a bias voltage, i.e., $\Delta V$, at the beginning of a preset clock period $T_{sample}$, and the second voltage does not drop by more than a first amplitude in the clock period $T_{sample}$. For example, the first amplitude may be 1%, 2%, 3%, 4%, 5%, 6%, 7%, 8%, 9% or 10%, or an interval between any two of the foregoing numbers, of $\Delta V$. The magnitude of the bias voltage $\Delta V$ is related to the first voltage $V_1$.

Specifically, the voltage adjustment circuit 100 may include a voltage bias circuit 110 and a step voltage generating circuit 500.

The voltage bias circuit 110 may add the bias voltage $\Delta V$ to an input voltage $V_{in}$ of the voltage bias circuit 110 and output a voltage $V_{out}$. As an example, the voltage bias circuit 110 may include at least one of a voltage-controlled voltage source, or a voltage-controlled current source. For example, the voltage bias circuit 110 may be a voltage-controlled current source.

Figure 3A:
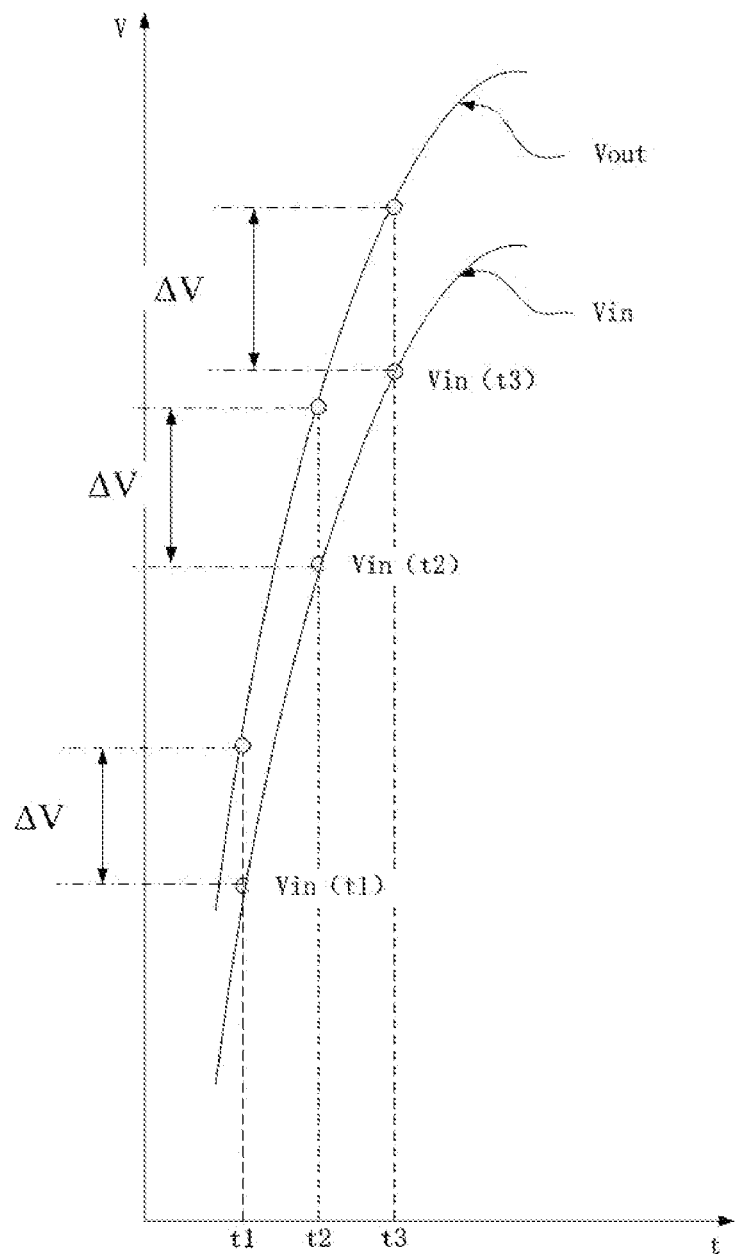
FIG. 3A illustrates a comparison between an input voltage and an output voltage of a voltage bias circuit according to some exemplary embodiments of the present disclosure.

As an example, the bias may be a positive bias (the bias voltage $\Delta V$ is a positive voltage), for example, the output voltage $V_{out}$ is higher than the input voltage Vin by $\Delta V$, that is, $V_{out}=V_{in}+\Delta V$. The bias may also be a negative bias (the bias voltage $\Delta V$ is a negative voltage), for example, the output voltage $V_{out}$ is lower than the input voltage $V_{in}$ by $\Delta V$, that is, $V_{out}=V_{in}-\Delta V$. For ease of description, in the following description of the present disclosure, $V_{out}=V_{in}+\Delta V$ is taken as an example to illustrate the working mechanism of the rising edge detection circuit. As an example, FIG. 3A illustrates a comparison between the input voltage $V_{in}$ and the output voltage $V_{out}$ of the voltage bias circuit 110 according to some exemplary embodiments of the present disclosure. Referring to FIG. 3A, the input voltage $V_{in}$ rises along the rising edge, and the voltage bias circuit 110 adds the bias voltage $\Delta V$ to $V_{in}$ to generate $V_{out}$.

It should be noted that FIG. 3A exemplarily describes the working process of the voltage bias circuit 110 by taking the rising edge as an example, and the mechanism is the same for the falling edge.

Referring to FIG. 1, the step voltage generating circuit 500 may convert a voltage input to the step voltage generating circuit into a step voltage. For example, the step voltage generating circuit 500 may include a switch circuit 120, a clock circuit 300 and a voltage holding circuit 130. As an example, the switch circuit 120 may include at least one field-effect transistor (FET). As an example, the FET may include, but is not limited to, a metal oxide semiconductor field-effect transistor (MOSFET), a bipolar junction transistor (BJT), a silicon controlled rectifier (SCR), a gate turn-off thyristor (GTO), an insulated gate bipolar transistor (IGBT), a MOS-controlled thyristor (MCT), or a static induction transistor (SIT). The clock circuit 300 is connected to the switch circuit 120 and controls the switch circuit 120 to be disconnected and connected according to the clock period $T_{sample}$ to generate the second voltage $V_2$. The voltage holding circuit 130 is connected to the switch circuit 120 and holds the second voltage $V_2$ after the switch circuit 120 is disconnected, such that the second voltage does not drop by more than the first amplitude in the clock period $T_{sample}$. In this way, the second voltage $V_2$ applied to the second comparator input terminal 220 remains substantially constant during the clock period $T_{sample}$. As an example, the voltage holding circuit 130 may include at least one capacitor circuit.

As mentioned above, the first voltage $V_1$ is different from the second voltage $V_2$ by the bias voltage $\Delta V$ at the beginning of the preset clock period $T_{sample}$, and the second voltage does not drop by more than the first amplitude in the clock period $T_{sample}$.

The working mechanism of the voltage fluctuation detection circuit 001 will be described below.

For ease of description, in the following description of the present disclosure, a "first circuit S1" denotes a circuit connecting the input terminal 101 and the first output terminal 102 of the voltage adjustment circuit, and a "second circuit S2" denotes a circuit connecting the input terminal 101 and the second output terminal 103 of the voltage adjustment circuit. The operating voltage signal $V_0$ may be transmitted to the first comparator input terminal 210 and the second comparator input terminal 220 via the first circuit S1 and the second circuit S2, respectively. Referring to FIG. 1, an input terminal of the first circuit S1 is electrically connected to the operating voltage $V_0$, and an output terminal thereof is the first output terminal 102 of the voltage adjustment circuit. The first circuit S1 may convert the operating voltage $V_0$ into the first voltage $V_1$. An input terminal of the second circuit S2 is electrically connected to the operating voltage $V_0$, and an output terminal thereof is the second output terminal 103 of the voltage adjustment circuit. The second circuit S1 may convert the operating voltage $V_0$ into the second voltage $V_2$.

Referring to FIG. 1, the voltage divider circuit 400 divides the input signal $V_{HV}$ into the operating voltage $V_0$. The operating voltage $V_0$ is then input to the adjustment circuit 100 from the input terminal 101 of the adjustment circuit. The adjustment circuit 100 adjusts the operating voltage $V_0$ to the first voltage $V_1$ and the second voltage $V_2$, which are respectively output from the first output terminal 102 and the second output terminal 103 of the adjustment circuit. The first comparator input terminal 210 is a positive terminal, and the second comparator input terminal 220 is a negative terminal. The first comparator input terminal 210 of the comparator is connected to the first output terminal 102 of the adjustment circuit and receives the first voltage $V_1$, and the second comparator input terminal 220 of the comparator is connected to the second output terminal 103 of the adjustment circuit and receives the second voltage $V_2$.

The first output terminal 102 of the voltage adjustment circuit 100 is electrically connected to the input terminal 101 thereof. For example, as shown in FIG. 1, two ends of the first circuit S1 may be directly connected to the output terminal 420 of the voltage divider circuit 400 and the first comparator input terminal 210 of the comparator. Therefore, the first voltage $V_1$ delivered to the first comparator input terminal 210 of the comparator via the first circuit S1 is equivalent to the operating voltage $V_0$ output from the output terminal of the voltage divider circuit 400, that is, $V_1=V_0$.

The voltage bias circuit 110 is connected in series with the step voltage generating circuit 500, and the circuits in series are respectively connected to the input terminal 101 and the second output terminal 103 of the voltage adjustment circuit. For example, as shown in FIG. 1, the voltage bias circuit 110 and the step voltage generating circuit 500 may be connected in series and arranged on the second circuit S2. The input terminal of the voltage bias circuit 110 may be electrically connected to the output terminal 420 of the voltage divider circuit 400. The voltage bias circuit 110 may add the bias voltage to the operating voltage $V_0$. The voltage bias circuit 110 is configured to bias the operating voltage $V_0$ by $\Delta V$. In other words, the voltage bias circuit 110 may add the bias voltage $\Delta V$ to the operating voltage $V_0$. The bias voltage shown in FIG. 1 is a positive voltage.

The clock circuit 300 is connected to the switch circuit 120. The clock circuit 300 sends out a clock pulse based on the preset clock period $T_{sample}$ to control the on and off of the switch circuit 120.

One terminal of the switch circuit 120 is connected to the output terminal of the voltage bias circuit 110, and the other terminal thereof is used as the output terminal of the voltage adjustment circuit 100 and connected to the second comparator input terminal 220. When the switch circuit 120 is turned on, the second voltage $V_2$ output from the output terminal of the voltage bias circuit 110 may be connected to the second comparator input terminal 220. When the switch circuit 120 is turned off, the second voltage V2 cannot be connected to the second comparator input terminal 220. As an example, the switch circuit 120 may include at least one FET or other circuit that may be controlled to turn on and off a power supply.

One terminal of the voltage holding circuit 130 is grounded (GND), and the other terminal thereof is connected to the second circuit S2 between the switch circuit 120 and the second comparator input terminal 220. The voltage holding circuit 130 is used to stabilize the second voltage V2, which is previously applied to the second comparator input terminal 220 when the switch circuit 120 is connected, within a preset range in the preset clock period after the switch circuit 120 is disconnected. As an example, the voltage holding circuit 130 includes at least one capacitor circuit. For example, in FIG. 1, the voltage holding circuit 130 includes a capacitor $C_{hold}$. When the switch circuit 120 is in a connected state, the second circuit S2 is connected to apply the second voltage $V_2$ to the second comparator input terminal 220, and the capacitor $C_{hold}$ is charged to the second voltage $V_2$. When the switch circuit is in a disconnected state, the voltage $V_2$ of the capacitor $C_{hold}$ is applied to the second comparator input terminal 220 as an input signal of the second comparator input terminal 220, such that the input signal of the second comparator input terminal 220 may be stabilized at the second voltage $V_2$.

Figure 3B:
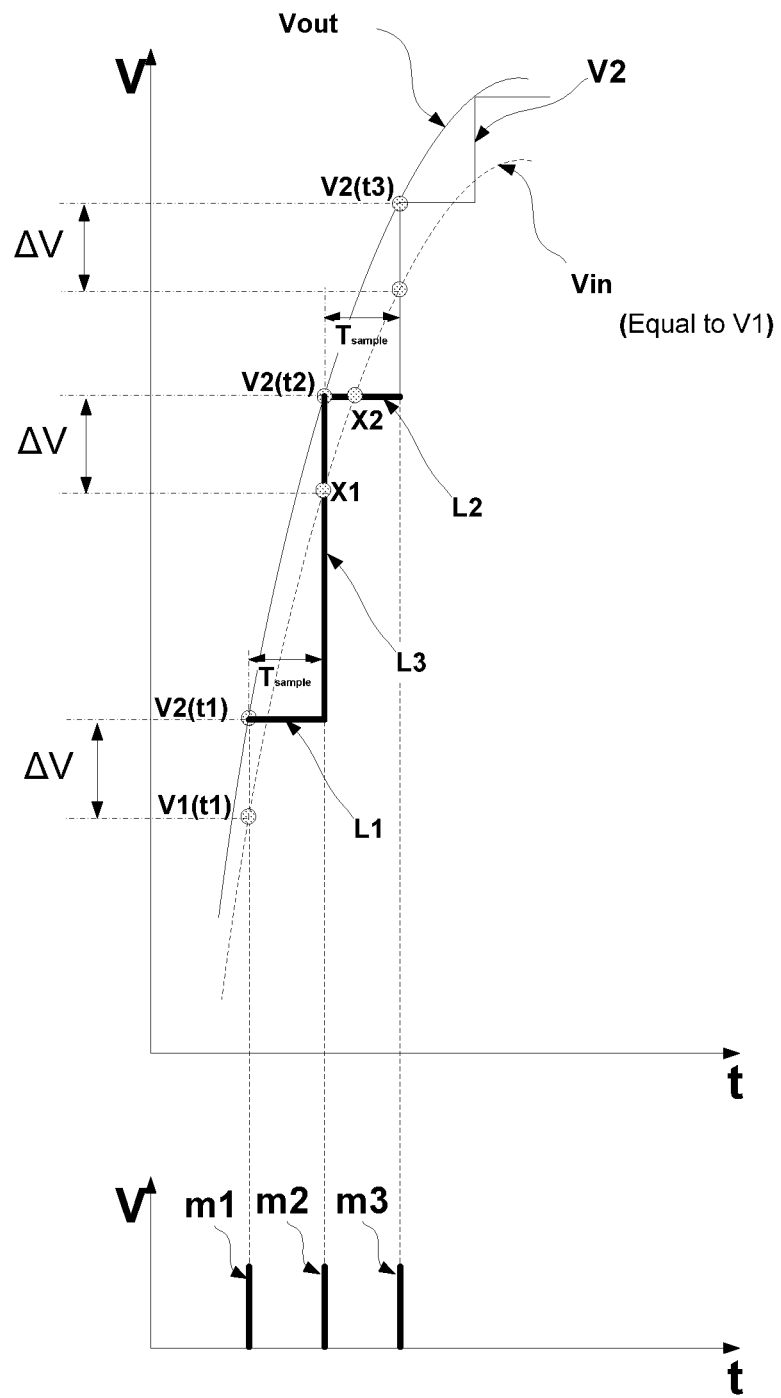
FIG. 3B illustrates a comparison between a voltage on an output terminal of the voltage bias circuit and a second voltage applied to a second input terminal of a comparator according to some exemplary embodiments of the present disclosure.

As an example, FIG. 3B illustrates a comparison between the voltage $V_{out}$ of the output terminal of the voltage bias circuit and the second voltage $V_2$ applied to the second comparator input terminal 220 of the comparator according to some exemplary embodiments of the present disclosure ($\Delta V>0$). FIG. 3B also shows a timing diagram of the voltage $V_{in}$ at the input terminal of the voltage bias circuit with a dotted line.

A pulse signal $m_1$ occurs at time $t_1$. At this time, the voltage at the first comparator input terminal 210 is $V_1(t_1)$. When the pulse signal $m_1$ arrives, the switch circuit 120 is connected, and the voltage at the second comparator input terminal 220 is $V_2(t_1)=V_1(t_1)+\Delta V$. When the switch circuit 120 is connected, the capacitor $C_{hold}$ is charged, such that the voltage across positive and negative terminals of the capacitor $C_{hold}$ becomes $V_2(t_1)$. After the pulse signal $m_1$ ends, the switch circuit 120 is disconnected. The voltage stabilizing effect of the capacitor $C_{hold}$ causes the second voltage at the second comparator input terminal 220 to basically stabilize at $V_2(t_1)$. The stabilization time is a clock period $T_{sample}$ of the pulse signal, which is indicated by a horizontal line L1 in FIG. 4. As mentioned above, the "basically stabilize" means that the voltage stabilizing effect of the capacitor $C_{hold}$ allows the second voltage at the second comparator input terminal 220 to slightly drop on the basis of $V_2(t_1)$. Such a drop does not exceed the first amplitude, for example, the first amplitude may be 1%, 2%, 3%, 4%, 5%, 6%, 7%, 8%, 9% or 10% of $\Delta V(t_1)$, or it may be in an interval between any two of these numbers.

A pulse signal $m_2$ occurs at time $t_2$. When the pulse signal $m_2$ arrives, the voltage at the first comparator input terminal 210 is $V_1(t_2)$. The switch circuit 120 is connected again, and the voltage at the second comparator input terminal 220 increases instantaneously from $V_2(t_1)$ to the voltage at the output terminal of the voltage bias circuit, that is, $V_2(t_2)=V_1(t_2)+\Delta V(t_2)$. When the switch circuit 120 is connected, the capacitor $C_{hold}$ is charged, such that the voltage across positive and negative terminals of the capacitor $C_{hold}$ becomes $V_2(t_2)$. After the pulse signal $m_2$ ends, the switch circuit 120 is disconnected. The voltage stabilizing effect of the capacitor $C_{hold}$ causes the second voltage at the second comparator input terminal 220 of the comparator to basically stabilize at $V_2(t_2)$. The stabilization time is a clock period $T_{sample}$ of the pulse signal, which is indicated by the horizontal line L2 in FIG. 4. As mentioned above, the "basically stabilize" means that the voltage stabilizing effect of the capacitor $C_{hold}$ allows the second voltage at the second comparator input terminal 220 of the comparator to slightly drop on the basis of $V_2(t_2)$. Such a drop does not exceed the first amplitude, for example, the first amplitude may be 1%, 2%, 3%, 4%, 5%, 6%, 7%, 8%, 9% or 10% of $\Delta V(t_2)$, or it may be in an interval between any two of these numbers.

The timing of the voltage $V_2$ applied to the second comparator input terminal 220 of the comparator is shown in FIG. 3B. Since the magnitude of the first voltage $V_1$ is equivalent to that of $V_{in}$, the relationship between the first voltage $V_1$ and the second voltage $V_2$ can be obtained. As an example, FIG. 3B also shows the timing of the first voltage $V_1$ applied to the first input terminal 220 of the comparator and the second voltage $V_2$ applied to the second comparator input terminal 220 of the comparator according to some exemplary embodiments of the present disclosure.

Referring to FIG. 3B, the switch circuit 120 receives the pulse signal $m_2$ of the clock circuit 300 at time $t_2$. The pulse signal $m_2$ causes the second voltage to increase from $V_2(t_1)$ to $V_2(t_2)$, which is indicated by a vertical line L3 in FIG. 3B. $V_2$ and $V_1$ cross at a cross point X1. The time corresponding to X1 is $t_2$. Before time $t_2$, the first voltage is above the second voltage, that is, the first voltage is higher than the second voltage. After time $t_2$, the first voltage is below the second voltage, that is, the first voltage is lower than the second voltage. The first voltage $V_1$ is applied to the first input terminal of the comparator, and the second voltage $V_2$ is applied to the second input terminal of the comparator. Therefore, before the clock signal $m_2$ arrives, the first voltage is higher than the second voltage, and the comparator output terminal 230 of the comparator 200 outputs a high level. After the clock signal $m_2$ ends, the first voltage is lower than the second voltage, and the comparator output terminal 230 of the comparator 200 outputs a low level. That is, when the clock signal $m_2$ arrives, the comparator flips from a high level to a low level. Therefore, the clock signal $m_2$ can cause the comparator to flip once.

Referring to FIG. 3B, as described above, the second voltage $V_2$ is maintained at $V_2(t_2)$ (indicated by the horizontal line L2) in a duration from the end of the pulse signal $m_2$ to the arrival of a pulse signal $m_3$ (that is, a $t_2-t_3$ interval in FIG. 3B). In this duration, the first voltage $V_1$ continuously climbs from the cross point $X_1$. The first voltage and the second voltage cross again at point X2. The time corresponding to the cross point X2 is $t_{x2}$. That is, at $t_{x2}$, the comparator flips again. As described above, at the time corresponding to the cross point X1, the output of the comparator flips from high to low (that is, a falling edge occurs). At the time corresponding to the cross point X2, the output of the comparator is flipped from low to high (that is, a rising edge occurs). At the time $t_3$ when the next pulse signal $m_3$ arrives, the output of the comparator is flipped from high to low again (that is, a falling edge occurs again).

The second voltage $V_2$ is lower than the first voltage $V_1$ at the beginning of the clock period $T_{sample}$. In a clock period $T_{sample}$, when the rising amplitude of the operating voltage $V_0$ exceeds the bias voltage, the output of the comparator 200 undergoes at least one flip between the high and low levels.

It should be noted that the premise of the above-mentioned flip is that at the beginning of the clock period $T_{sample}$, $\Delta V$ causes the step voltage $V_2$ to be higher than the voltage $V_1$ that naturally fluctuates with $V_0$. The fluctuation interval of the voltage $V_1$ in one clock period $T_{sample}$ is higher than $\Delta V$, such that $V_1$ crosses with $V_2$. Under this condition, every time a pulse signal arrives, the output of the comparator is flipped from high to low (that is, a falling edge occurs). The output of the comparator between two pulse signals is flipped from low to high (that is, a rising edge occurs). When the next pulse signal arrives, the output of the comparator is flipped from high to low again (that is, a falling edge occurs again).

As described above, when the input signal $V_{HV}$ shown in FIG. 2 is an AC signal and $V_{HV}$ is at the falling edge, the first voltage $V_1$ drops with time, and it is lower than the second voltage $V_2$ at the beginning of the $V_1$ clock period. Therefore, the second voltage $V_2$ is always higher than the first voltage $V_1$, and the output terminal of the comparator 200 always outputs a low level, and thus no flip occurs.

In summary, when $V_{HV}$ is at the rising edge, the output of the comparator will be flipped, that is, the comparator may output a pulse. When $V_{HV}$ is at the falling edge, the output of the comparator is not flipped, that is, the comparator does not output a pulse.

Therefore, by detecting whether the comparator can output a pulse by the detection and output circuit 700, it can be known whether the $V_{HV}$ is currently at a rising edge or a falling edge.

The voltage fluctuation detection circuit provided by the present disclosure may detect the voltage of the AC line.

Firstly, the circuit has a simple structure and a small number of components, which can reduce the cost and volume of the IC.

In addition, the circuit has high accuracy and can achieve a balance between the circuit complexity, detection accuracy, detection speed and low cost, so as to achieve a balance between the optimal performance and the cost of the IC. For example, the frequency of the pulse output by the comparator may be controlled by simply setting the value of $\Delta V$ and the frequency of the sampling clock $T_{sample}$.

Further, for an analog IC (including, but not limited to, a switching power supply controller, an audio/video amplifier or a signal converter), if a digital circuit is used to sample and detect the characteristic of the electrical signal, the addition of a digital design to the analog IC will increase the cost of the IC. In the detection circuit provided by the present disclosure, the input signal $V_{HV}$ may be an analog signal. When the detection circuit is applied to the analog IC, it can greatly reduce the complexity of the analog IC, and can achieve a balance between the circuit complexity, detection accuracy, sufficiently fast detection speed and low cost, so as to achieve a balance between the optimal performance and the cost of the IC.

The AC-DC controller can convert Alternating Current (AC) into Direct Current (DC) to implement the work of electronic circuits. On the one hand, the input signal of current AC-DC controller may only be AC, but not DC. On the other hand, for IC operation, the characteristics of input signals are important sensing information. Therefore, for IC operation, the control of an AC-DC power supply module(s) needs the information regarding the characteristics of the input signal of AC line, that is, whether the input voltage is DC or AC. At the same time, because the stability of some input voltages is not ideal, even DC voltage may have some fluctuations and noises. These disturbance and noises may affect the judgment on input signal characteristics.

In some exemplary embodiments, the operating current of the AC-DC controller can be expanded from DC to DC and AC to expand the operating conditions of the controller so as to enable the controller work in various environments. A detection circuit to detect whether the input signal is AC signal or DC signal is needed for designing a controller meeting both DC input and AC input requirements.

Regarding the voltage fluctuation detection circuit provided by the present disclosure, in the case where the input signal $V_{HV}$ is a DC signal, if noise and disturbance are not considered, or although $V_{HV}$ fluctuates, the fluctuation range is not large enough to require surpassing $V_1$ over $V_2$ in one clock period $T_{sample}$, the output terminal of the comparator 200 does not flip.

For example, referring to FIG. 1, when the input signal $V_{HV}$ is DC, if noise and disturbance are not considered, the first voltage $V_1$ does not change in the clock period $T_{sample}$, and $V_1=V_0$. The voltage at the input terminal of the voltage bias circuit is $V_{in}=V_0=V_1$, and the voltage at the output terminal of the voltage bias circuit 110 is $V_{out}=V_0+\Delta V=V_1+\Delta V$. In the clock period $T_{sample}$, $V_{out}$ remains unchanged. When the switch circuit 120 is connected, $V_2=V_{out}=V_0+\Delta V=V_1+\Delta V$. When the switch circuit is disconnected, $V_2=V_C=V_{out}=V_0+\Delta V=V_1+\Delta V$. That is, in the entire clock period, $V_2$ is always higher than $V_1$ by $\Delta V$, that is, $V_2=V_1+\Delta V$. $V_2$ and $V_1$ do not cross, so the output terminal of the comparator always outputs a low level.

Therefore, if the value of $\Delta V$ can be properly selected, the voltage fluctuation detection circuit 001 can detect whether the operating voltage $V_0$ is AC or DC. The voltage adjusting circuit 100 is for the operating voltage $V_0$, and outputs a first voltage $V_1$ through the first voltage adjusting circuit output terminal 102 and a second voltage $V_2$ through the second voltage adjusting circuit output terminal 103. The second voltage $V_2$ differs from the first voltage $V_1$ by a bias voltage $\Delta V$ at the beginning of a preset clock period $T_{sample}$, and the second voltage $V_2$ falls within a first amplitude within the clock period $T_{sample}$.

At the beginning of the clock period $T_{sample}$, the bias voltage $\Delta V$ is added to the first voltage $V_1$ by the voltage bias circuit 110 to make the second voltage $V_2$ generate a step. Before the step, the second voltage is less than the first voltage, and the comparator outputs a high level. After the step, the second voltage is greater than the first voltage, and the comparator outputs a low level. That is, this step makes the output of the comparator change from high level to low level. In other words, at the beginning of clock period $T_{sample}$, the second voltage $V_2$ is stepped by a bias voltage $\Delta V$, which makes the second voltage $V_2$ and the first voltage $V_1$ cross once and the comparator flip once.

In other words, the voltage fluctuation detection circuit provided in this disclosure can be used for AC-DC controllers. The voltage fluctuation detection circuit can detect whether the operating current of the AC-DC controller is AC or DC, thereby facilitating the expansion of the operating current of the AC-DC controller from DC to DC and AC.

In summary, in the voltage fluctuation detection circuit provided by the present disclosure, the voltage bias circuit 110 in the voltage adjustment circuit 100 adds a bias to the operating voltage $V_0$. The bias is stored in the capacitor $C_{hold}$ when the switch is turned on. The bias signal is sampled and held by the switch downstream of the voltage bias circuit 110, the clock signal and the capacitor $C_{hold}$. Slopes of the first voltage signal (direct sample) applied to the first input terminal of the comparator and the second voltage applied to the second input terminal of the comparator are different, such that a crossing occurs in the clock period. The output of the comparator is flipped every time a crossing occurs. By determining whether the comparator outputs a pulse signal, the characteristic of the input electrical signal may be determined, for example, whether the input signal fluctuates, whether the input signal is at a rising edge or a falling edge.

In some exemplary embodiments, the magnitude of $\Delta V$ is constant, regardless of the characteristic of the input voltage $V_{in}$.

Figure 4A:
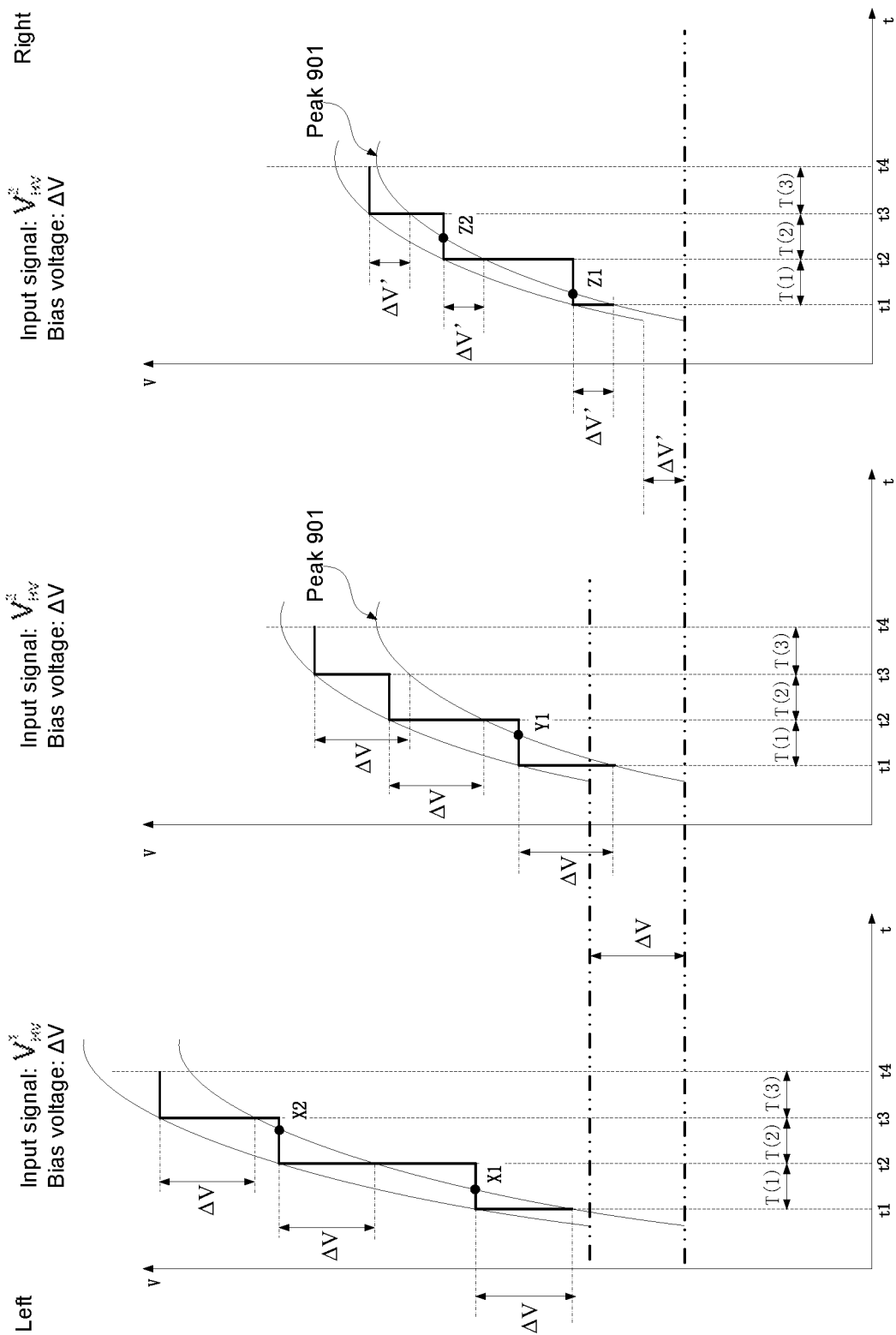
FIG. 4A illustrates a comparison of outputs corresponding to two different inputs under a constant ΔV according to some exemplary embodiments of the present disclosure.

As an example, FIG. 4A illustrates a comparison of outputs corresponding to two different inputs $V_{HV}^1$ and $V_{HV}^2$ under a constant $\Delta V$ according to some exemplary embodiments of the present disclosure.

FIG. 4A shows three diagrams in sequence from left to right. In the three diagrams, the sampling clock period is $T_{sample}$. In the left diagram of FIG. 4A, a corresponding input signal is $V_{HV}^1$, and a corresponding bias voltage is $\Delta V$. In the middle diagram of FIG. 4A, a corresponding input signal is $V_{HV}^2$, and a corresponding bias voltage is $\Delta V$. In the right diagram of FIG. 4A, a corresponding input signal is $V_{HV}^2$, and a corresponding bias voltage is $\Delta V'$. In FIG. 4A, the peak of the signal $V_{HV}^2$ is higher than that of the signal $V_{HV}^1$, and $\Delta V'$ is higher than $\Delta V$.

Referring to the left diagram in FIG. 4A, when the input signal is $V_{HV}^1$, in a clock period T(1), V1 and V2 cross (cross point X1), and the comparator outputs a pulse. In a clock period T(2), V1 and V2 cross (cross point X2), and the comparator outputs a pulse. In a clock period T(3), V1 and V2 do not cross (cross point X2), and the comparator stops outputting a pulse. According to the above description, the detection and output circuit 700 determines whether the input signal $V_{HV}$ is currently at a rising edge or a falling edge by determining whether the comparator can output a pulse. If the detection and output circuit 700 is configured to output a signal indicating a falling edge when a next clock pulse (corresponding to a pulse m4 at t4 in the left diagram of FIG. 4A) arrives after the comparator stops outputting a pulse, then, as shown in the left diagram of FIG. 4A, the detection and output circuit 700 outputs a signal at t4 to indicate that the $V_{HV}$ changes from a rising edge to a falling edge. In some embodiments, a second target circuit may be provided in the detection and output circuit 700 to monitor the output of the comparator. For example, if the second target circuit is configured to detect the output of the comparator, when the pulse m4 at time t4 arrives, the output of the second target circuit undergoes a flip. As an example, the second target circuit may be a monitoring circuit. As an example, the monitoring circuit may include a power-on prohibition unit or a switch signal prohibition unit. In some exemplary embodiments, the power-on prohibition unit may include a hardware-based power-on prohibition circuit, and the switch signal prohibition unit may include a hardware-based switch signal prohibition circuit. In some exemplary embodiments, the monitoring circuit may also be implemented by a software-controlled general-purpose circuit, for example, the general-purpose circuit may be controlled by a power-on prohibition program or a switch signal prohibition program to complete the function of the power-on prohibition circuit or the switch signal prohibition circuit.

Referring to the middle diagram of FIG. 4A, when the input signal is $V_{HV}^2$, $V_1$ and $V_2$ cross (cross point Y1) in the clock period T(1), and the comparator outputs a pulse. Since the clock period T(2), V1 and V2 do not cross, and the comparator stops outputting a pulse. According to the above description, the detection and output circuit 700 determines whether the input signal $V_{HV}$ is currently at a rising edge or a falling edge by determining whether the comparator may output a pulse. Similarly, if the detection and output circuit 700 is configured to output a signal indicating a falling edge when a next clock pulse (corresponding to a pulse m3 at t3 in the middle diagram of FIG. 4A) arrives after the comparator stops outputting a pulse, then, as shown in the middle diagram of FIG. 4A, the detection and output circuit 700 outputs a signal at t3 to indicate that the $V_{HV}$ changes from a rising edge to a falling edge. As an example, if the second target circuit is configured to detect the output of the comparator, when the pulse m3 at time t3 arrives, the output of the second target circuit undergoes a flip.

The left diagram of FIG. 4A is compared with the middle diagram of FIG. 4A. When the input signal is $V_{HV}^2$ with a small peak, if the same bias voltage ΔV is used, compared with the left diagram of FIG. 4A, the middle diagram of FIG. 4A shows that the time when the second target circuit undergoes a flip has a long wavelength band from a peak 901 of $V_{HV}^2$. That is, when the second target circuit undergoes a flip, $V_{HV}^2$ actually has a long wavelength band before it changes from a rising edge to a falling edge. This is because when the peak of the input signal $V_{HV}^2$ is small, its initial slope is also small. In this case, if it is determined directly according to the output result of the comparator that the rising edge is ended and the falling edge is started, the detection accuracy of the circuit is not very high.

In some exemplary embodiments, the magnitude of ΔV may be related to $V_{in}$.

Figure 4B:
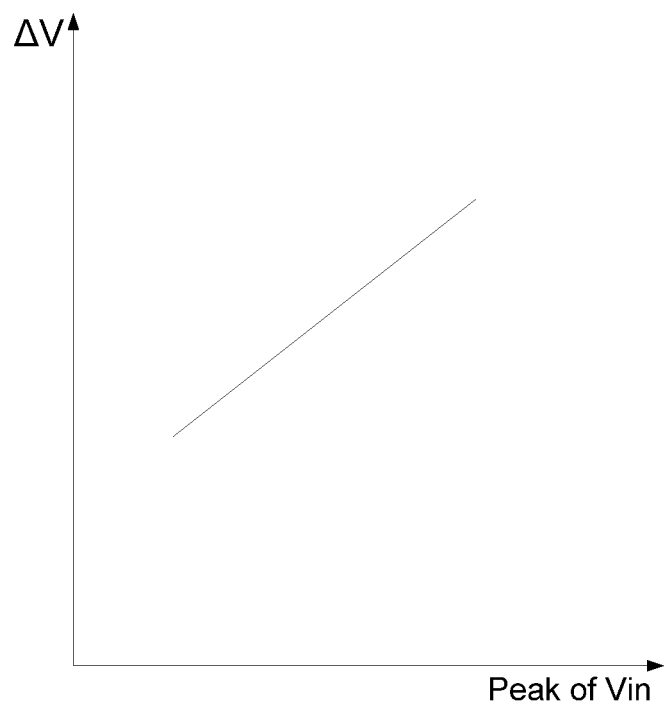
FIG. 4B illustrates a relationship between the ΔV and a peak of $V_{in}$ according to some exemplary embodiments of the present disclosure.
Figure 4C:
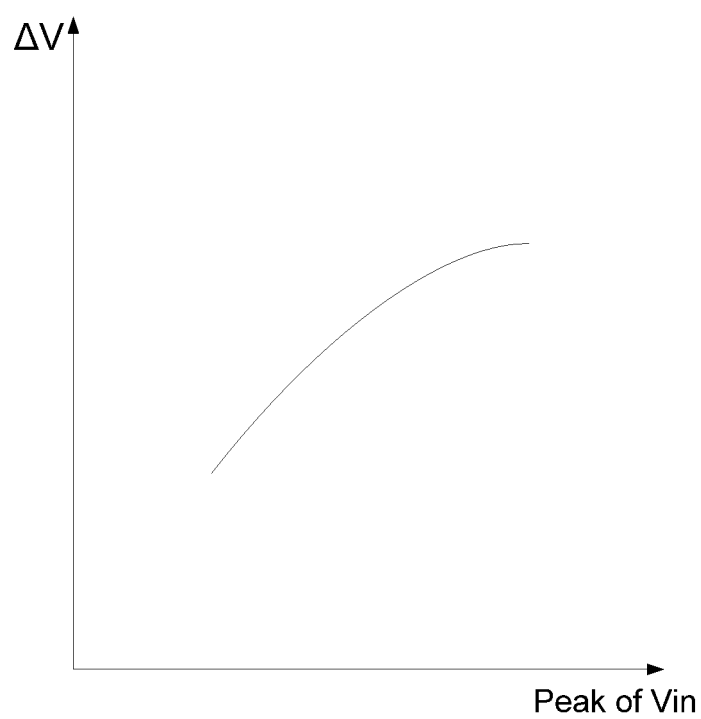
FIG. 4C illustrates a relationship between the ΔV and the peak of $V_{in}$ according to some exemplary embodiments of the present disclosure.

As an example, the magnitude of ΔV may be positively correlated with the peak of $V_{in}$. That is, if the peak of $V_{HV}^2$ is lower than that of $V_{HV}^1$, then the value of $\Delta V_2$ is lower than that of $\Delta V_1$. As an example, FIG. 4B illustrates a relationship between ΔV and the peak of $V_{in}$ according to some exemplary embodiments of the present disclosure. In the exemplary embodiments shown in FIG. 4B, ΔV=K·(peak of $V_{in}$), where K is a constant value, that is, ΔV has a linear positive correlation with the peak of $V_{HV}$. It should be noted that FIG. 4B is only an example to describe the positive correlation between ΔV and the peak of $V_{HV}$. The positive correlation between ΔV and the peak of $V_{HV}$ may also be non-linear without affecting the core spirit of the present disclosure. For example, FIG. 4C illustrates another relationship between ΔV and the peak of $V_{in}$ according to some exemplary embodiments of the present disclosure. In FIG. 4C, ΔV is positively, but not linearly correlated with the peak of $V_{HV}$. Of course, in some exemplary embodiments, the magnitude of ΔV may also change in real time with $V_{in}$. For example, $\Delta V(t)=K \cdot V_{in}(t)$.

Referring to FIG. 4A, as shown in the right diagram of FIG. 4A, when the input signal is $V_{HV}^2$ with a small peak, if a small bias voltage ΔV' is used, in a clock period T(1), V1 and V2 cross (cross point Z1), and the comparator outputs a pulse. In a clock period T(2), V1 and V2 cross (cross point Z2), and the comparator outputs a pulse. Since a clock period T(3), V1 and V2 do not cross, and the comparator stops outputting a pulse. According to the above description, the detection and output circuit 700 determines whether the input signal $V_{HV}$ is currently at a rising edge or a falling edge by determining whether the comparator outputs a pulse. Similarly, if the detection and output circuit 700 is configured to output a signal indicating a falling edge when a next clock pulse (corresponding to a pulse m4 at t4 in the right diagram of FIG. 4A) arrives after the comparator stops outputting a pulse, then, as shown in the right diagram of FIG. 4A, the detection and output circuit 700 outputs a signal at t4 to indicate that the $V_{HV}$ changes from a rising edge to a falling edge. As an example, if the second target circuit is configured to detect the output of the comparator, when the pulse m4 at time t4 arrives, the output of the second target circuit undergoes a flip.

The middle diagram of FIG. 4A is compared with the right diagram of FIG. 4A. When the input signal is $V_{HV}^2$ with a small peak, if a small bias voltage ΔV' is used, compared with the middle diagram of FIG. 4A, the right diagram of FIG. 4A shows that the time when the output signal of the second target circuit is flipped is delayed backward by one clock period $T_{sample}$. Compared with the middle diagram of FIG. 4A, in the right diagram, the input signal $V_{HV}$ corresponding to the time when the output signal of the second target circuit is flipped is closer to the peak 901, which improves the detection accuracy of the circuit.

It should be noted that, in the above description, the principle of the voltage fluctuation detection circuit provided in this disclosure is introduced by taking the rising edge as an example. The voltage fluctuation detection circuit provided by the present disclosure may also detect the falling edge so as to detect the input signal. In the case where the input signal is at the falling edge, if the circuit is so constructed that the first voltage is higher than the second voltage at the beginning of the clock period $T_{sample}$, and the falling amplitude of the first voltage V1 exceeds the bias voltage value within one clock period, the output of the comparator is flipped at least once.

For example, the bias voltage in FIG. 1 may be set as −ΔV. In this case, the first voltage is higher than the second voltage at the beginning of the clock period Tsample, and in one clock period the falling amplitude of the first voltage $V_1$ exceeds the bias voltage amplitude ΔV, the output of the comparator 200 is flipped at least once.

Figure 5:
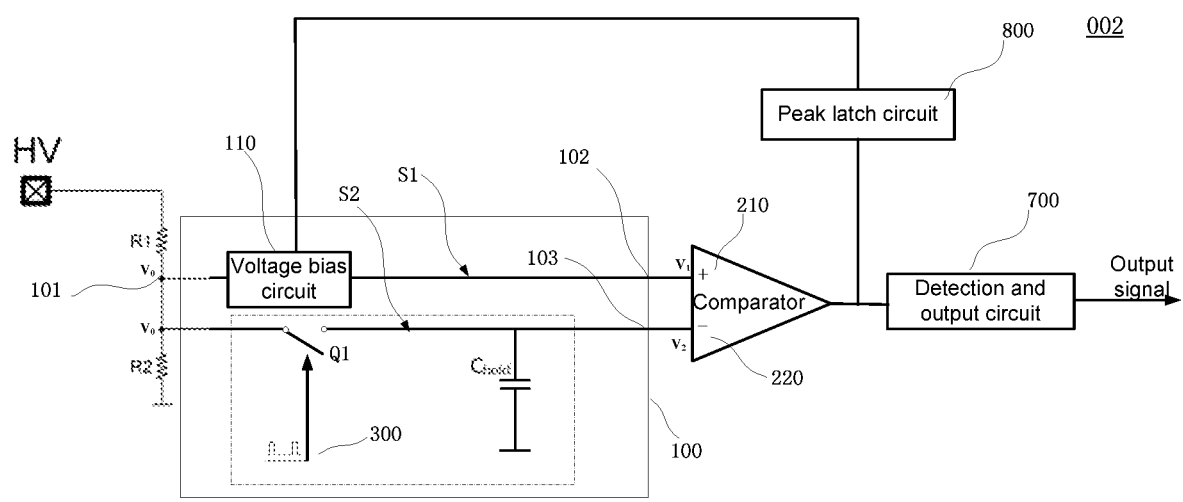
FIG. 5 illustrates a structure of a voltage fluctuation detection circuit according to some exemplary embodiments of the present disclosure.

FIG. 5 illustrates a structure of another voltage fluctuation detection circuit 002 according to some exemplary embodiments of the present disclosure.

Referring to FIG. 5, the voltage bias circuit 110 is provided on the first circuit S1. The voltage bias circuit 110 is connected in series with the first output terminal 102 and the input terminal 101 of the adjustment circuit. That is, two ends of the voltage bias circuit 110 are respectively connected to the output terminal 101 and the first output terminal 102 of the adjustment circuit.

The step voltage generating circuit 500 is provided on the second circuit S2. The step voltage generating circuit 500 is connected in series with the input terminal 101 and the second output terminal 103 of the adjustment circuit. That is, two ends of the step voltage generating circuit 500 are respectively connected to the output terminal 101 and the second output terminal 103 of the adjustment circuit. Referring to FIG. 5, the first comparator input terminal 210 of the comparator is a positive terminal, the second comparator input terminal 220 of the comparator is a negative terminal, and the bias voltage is a negative voltage $-\Delta V$.

Figure 6:
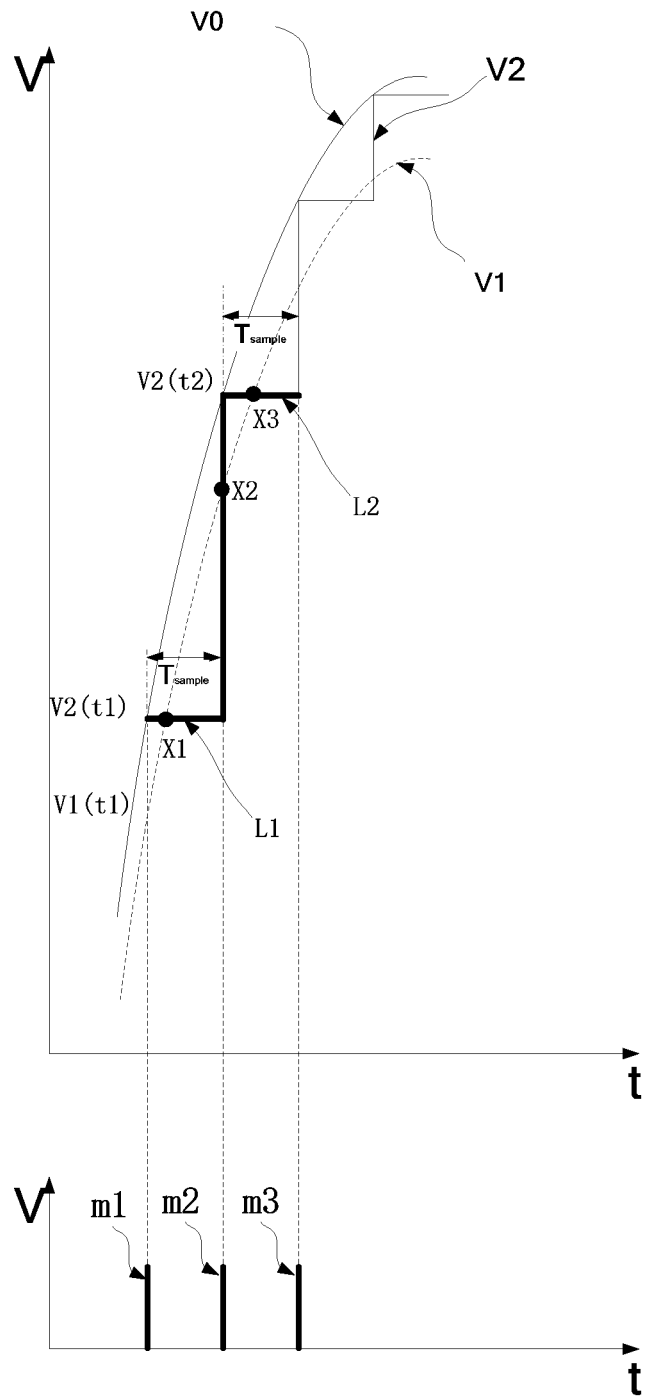
FIG. 6 illustrates a comparison between an operating voltage, a first voltage and a second voltage in the structure of the circuit shown in FIG. 5.

As an example, FIG. 6 illustrates a comparison between the operating voltage $V_0$, the first voltage $V_1$ and the second voltage $V_2$ in the structure of the circuit shown in FIG. 5.

The voltage bias circuit 110 adds a bias voltage to the operating voltage $V_0$ to generate the first voltage $V_1$. The bias voltage is negative, and its absolute value is equal to $\Delta V$, that is, the bias voltage is $-\Delta V$. Therefore, $V_1=V_0-\Delta V$. The timing of the first voltage $V_1$ is indicated by $V_1$ in FIG. 6.

The step voltage generating circuit 500 acts on the operating voltage signal $V_0$ to cause the operating voltage signal $V_0$ to step so as to generate a step-shaped second voltage $V_2$.

Referring to FIGS. 5 and 6, a switch $Q_1$ is turned on when the clock pulse $m_1$ arrives. The second voltage $V_2$ is equal to the operating voltage $V_0$, which is $V_2(t_1)$. When the switch $Q_1$ is turned on, the capacitor $C_{hold}$ is charged to $V_2(t_1)$. After the clock pulse $m_1$ ends, the switch $Q_1$ is turned off. The capacitor $C_{hold}$ keeps the voltage on the negative terminal of the comparator basically at $V_2(t_1)$ (indicated by the horizontal line L1 in FIG. 6), and the holding time is one clock period $T_{sample}$ of the clock pulse. The 'basically stabilize" means that the voltage stabilizing effect of the capacitor $C_{hold}$ allows the second voltage at the second comparator input terminal 220 of the comparator to slightly drop on the basis of $V_2(t_1)$. Such a drop does not exceed the first amplitude, for example, the first amplitude may be 1%, 2%, 3%, 4%, 5%, 6%, 7%, 8%, 9% or 10% of $\Delta V(t_1)$, or may be in an interval between any two of these numbers. It can be seen from FIG. 6 that the first voltage $V_1$ is lower than the second voltage $V_2$ at the beginning of the corresponding clock period $T_{sample}$ indicated by the horizontal line L1. In the clock period $T_{sample}$, the operating voltage $V_0$ rises along the rising edge, the first voltage $V_1$ also rises along the rising edge, but the second voltage $V_2$ remains substantially constant under the action of the capacitor $C_{hold}$. In this clock period, as the first voltage $V_1$ rises, the first voltage $V_1$ and the second voltage $V_2$ cross (cross point X1), and the comparator undergoes a flip.

When the clock pulse $m_2$ arrives, the switch $Q_1$ is connected, and the second voltage $V_2$ instantaneously increases to the operating voltage $V_0$, that is, $V_2(t_2)$. Before the clock pulse $m_2$ arrives, the magnitude of the second voltage $V_2$ is $V_2(t_1)$. The arrival of the clock pulse $m_2$ causes the second voltage $V_2$ to instantaneously rise from $V_2(t_1)$ to $V_2(t_2)$. Before the rise, the magnitude of the second voltage, i.e. $V_2(t_1)$, is lower than that of the first voltage $V_1$, that is, the voltage on the positive terminal of the comparator is higher than that on the negative terminal, and the comparator outputs a high level. After the rise, the magnitude of the second voltage $V_2(t_2)$ is higher than that of $V_1$, that is, the voltage on the positive terminal of the comparator is lower than that on the negative terminal, and the comparator outputs a low level. That is, the arrival of the clock pulse $m_2$ causes the first voltage $V_1$ and the second voltage $V_2$ to cross once (cross point X2), and the comparator flips once.

Meanwhile, when the clock pulse $m_2$ arrives and the switch $Q_1$ is turned on, the capacitor $C_{hold}$ is charged, such that the voltage across the positive and negative terminals of the capacitor $C_{hold}$ becomes $V_2(t_2)$. After the clock pulse $m_2$ ends, the switch $Q_2$ is turned off. The capacitor $C_{hold}$ keeps the second voltage $V_2$ applied to the negative terminal of the comparator at $V_2(t_2)$ (indicated by the horizontal line L2 in FIG. 6), and the holding time is one clock period $T_{sample}$ of the clock pulse.

In summary, a negative bias voltage can also be used to make the first voltage and the second voltage cross in the clock period and make the comparator flip. Thus, it can also be determined whether the input signal is a DC signal or an AC signal by determining the output of the comparator (for example, whether the comparator can output a pulse and the number of output pulses).

It should be noted that, for ease of description, in the above description, the principle of the AC/DC voltage detection circuit is described with the first input terminal of the comparator as a positive terminal and the second input terminal of the comparator as a negative terminal. The first input terminal of the comparator may also be a negative terminal and the second input terminal of the comparator may also be a positive terminal without affecting the core principle of the present disclosure.

In addition, the bias voltage in FIG. 5 can also be set to $+\Delta V$ for detecting the falling edge of the operating voltage V0. In this case, the first voltage is higher than the second voltage at the beginning of the clock period $T_{sample}$ and the falling amplitude of the first voltage V1 exceeds the bias voltage value amplitude $\Delta V$ within one clock period, the output of the comparator 200 is flipped at least once.

Figure 7:
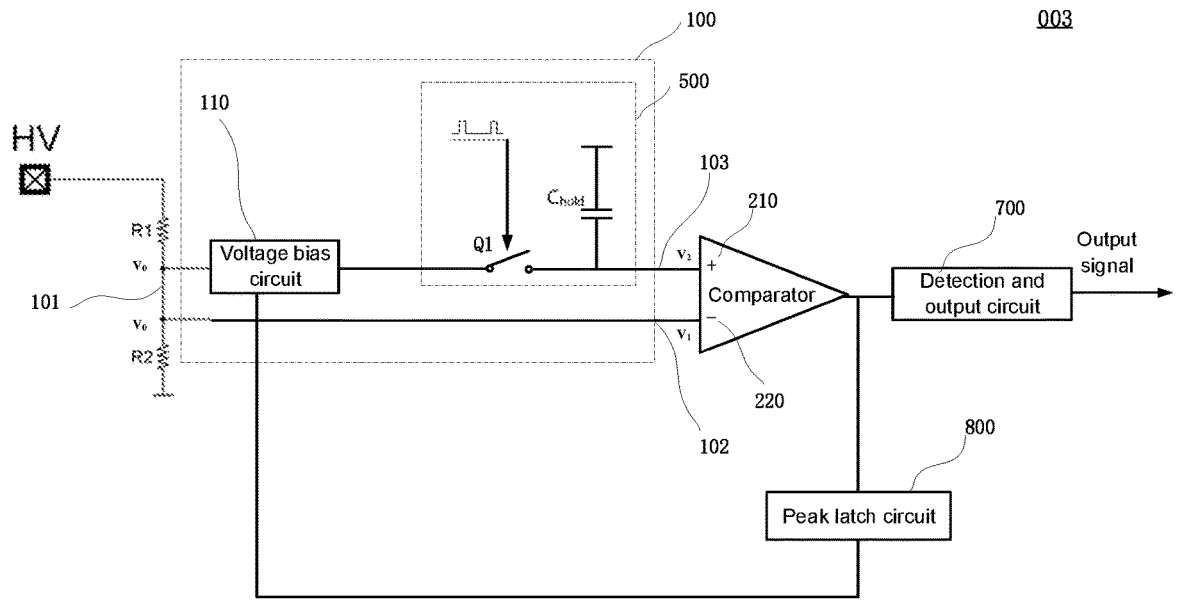
FIG. 7 illustrates a structure of a voltage fluctuation detection circuit according to some exemplary embodiments of the present disclosure.

FIG. 7 illustrates a structure of a voltage fluctuation detection circuit 003 according to some exemplary embodiments of the present disclosure. The circuit structure shown in FIG. 7 is similar to that shown in FIG. 1, except that in FIG. 7, the first output terminal of the voltage adjustment circuit is connected to the first input terminal of the comparator, and the first input of the comparator is a negative terminal of the comparator. In addition, in FIG. 7, the second output terminal of the voltage adjustment circuit is connected to the second input terminal of the comparator, and the second input terminal of the comparator is a positive terminal of the comparator. That is, the voltage bias circuit 110 is connected in series with the step voltage generating circuit 500 and is provided on the first circuit S1. Therefore, the first voltage is applied to the negative terminal of the comparator, and the second voltage is applied to the positive terminal of the comparator.

The comparison between the first voltage and the second voltage illustrated in FIG. 3B is applicable to the circuit structure shown in FIG. 7. Referring to FIG. 3B, in the circuit structure shown in FIG. 7, for every clock period that comes, the comparator flips once at the arrival of the clock period and flips again during the clock period. In the circuit structure shown in FIG. 7, taking the clock signal $m_2$ as an example, before the clock signal $m_2$ arrives, the second voltage $V_2(t_1)$ is lower than the first voltage $V_1$, that is, the voltage on the positive terminal of the comparator is lower than that on the negative terminal, and the comparator outputs a low level. The arrival of the clock pulse $m_2$ causes the second voltage to rise instantaneously from $V_2(t_1)$ to $V_2(t_2)$. After the rise, the second voltage $V_2(t_2)$ is higher than the first voltage $V_1$, that is, the voltage on the positive terminal of the comparator is higher than that on the negative terminal of the comparator, and the comparator outputs a high level. That is, the arrival of the pulse signal $m_2$ causes the comparator to flip from a low level to a high level. After the pulse signal $m_2$ ends, the second voltage is maintained at $V_2(t_2)$ under the action of the capacitor $C_{hold}$. As the first voltage rises along the rising edge, the second voltage and the first voltage cross again (cross point X2). Before the cross point X2, the second voltage is higher than the first voltage, that is, the voltage on the positive terminal of the comparator is higher than that on the negative terminal of the comparator, and the comparator outputs a high level. After the cross point X2, the second voltage is lower than the first voltage, that is, the voltage on the positive terminal of the comparator is lower than that on the negative terminal of the comparator, and the comparator outputs a low level. That is, in the clock period $T_{sample}$, the comparator flips from a high level to a low level.

When the clock pulse arrives, the comparator flips from a low level to a high level, and before the next clock pulse arrives, the comparator flips from a high level to a low level. Therefore, it can also be determined whether the input signal is a DC signal or an AC signal by determining the output of the comparator (for example, whether the comparator can output a pulse and the number of output pulses).

In addition, the bias voltage in FIG. 7 can also be set to $-\Delta V$ for detecting the falling edge of the operating voltage $V_0$. In this case, the first voltage is higher than the second voltage at the beginning of the clock period Tsample and the falling amplitude of the first voltage V1 exceeds the bias voltage value amplitude $\Delta V$ within one clock period, the output of the comparator 200 is flipped at least once.

Figure 8:
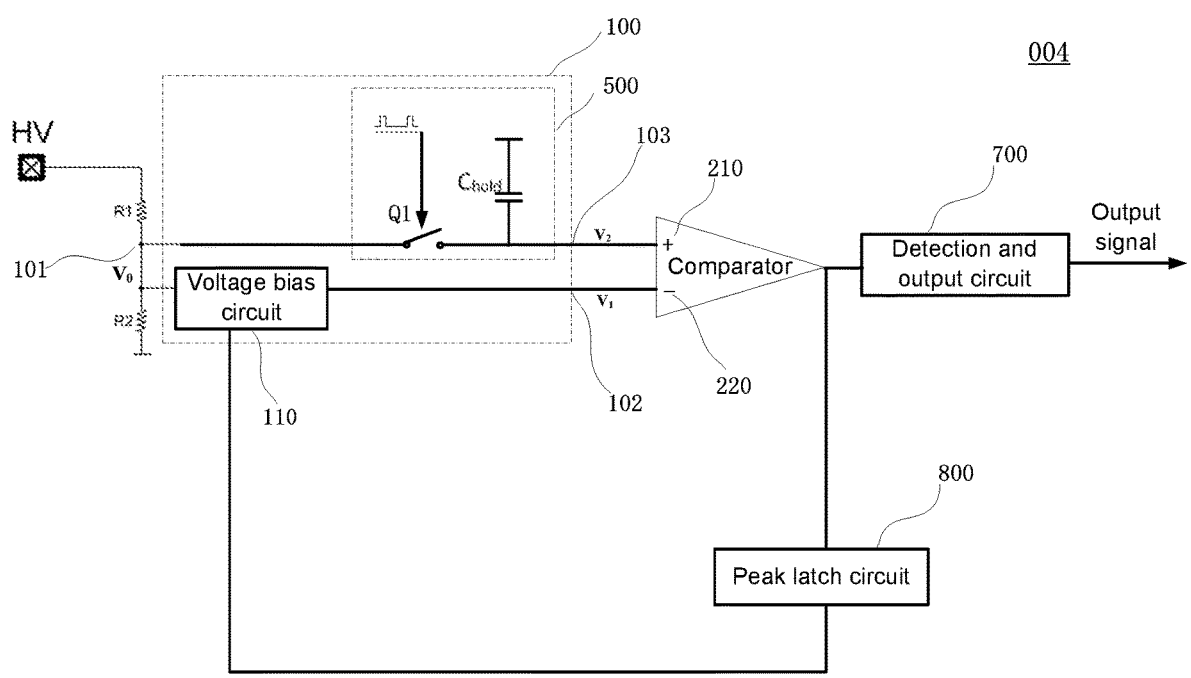
FIG. 8 illustrates a structure of a voltage fluctuation detection circuit according to some exemplary embodiments of the present disclosure.

FIG. 8 illustrates a structure of a voltage fluctuation detection circuit 004 according to some exemplary embodiments of the present disclosure. The circuit structure shown in FIG. 8 is similar to that shown in FIG. 5, except that in FIG. 8, the first output terminal of the voltage adjustment circuit is connected to the first input terminal of the comparator, and the first input of the comparator is a negative terminal of the comparator. In addition, in FIG. 8, the second output terminal of the voltage adjustment circuit is connected to the second input terminal of the comparator, and the second input terminal of the comparator is a positive terminal of the comparator. In other words, the first voltage is applied to the negative terminal of the comparator, and the second voltage is applied to the positive terminal of the comparator. The analysis of FIG. 8 may be referred to that of FIG. 5, which will not be repeated herein for the sake of brevity.

In summary, the voltage fluctuation detection circuit provided by the present disclosure adds a bias to the operating voltage $V_0$ through the voltage bias circuit 110 in the voltage adjustment circuit 100. The bias is stored in the capacitor $C_{hold}$ when the switch is turned on. The bias signal is sampled and held by the switch downstream of the voltage bias circuit 110, the clock signal and the capacitor $C_{hold}$. Slopes of the first voltage signal (direct sample) applied to the first input terminal of the comparator and the second voltage applied to the second input terminal of the comparator are different, such that a crossing occurs in the clock period. The output of the comparator is flipped every time a crossing occurs. By determining whether the comparator can output a pulse signal, the fluctuation of the electrical signal can be determined, for example, whether the electrical signal fluctuates, or whether the electrical signal is at a rising edge or a falling edge.

The voltage fluctuation detection circuit provided by the present disclosure can detect the voltage of an AC line. The circuit has a simple structure and a small number of components, which can reduce the cost and volume of the IC. The circuit has high accuracy and can achieve a balance between the circuit complexity, detection accuracy, sufficiently fast detection speed and low cost, so as to achieve a balance between the optimal performance and the cost of the IC. For example, the frequency of the pulse output by the comparator can be controlled only by reasonably setting the value of $\Delta V$ and the frequency of the sampling clock $T_{sample}$.

For an analog IC (including, but not limited to, a switching power supply controller, an audio/video amplifier or a signal converter), if a digital circuit is used to sample and detect the characteristic of the electrical signal, the addition of a digital design to the analog IC will increase the cost of the IC. In the detection circuit provided by the present disclosure, the input signal $V_{HV}$ may be an analog signal. When the detection circuit is applied to the analog IC, it can greatly reduce the complexity of the analog IC, and can achieve a balance between the circuit complexity, detection accuracy, sufficiently fast detection speed and low cost, so as to achieve a balance between the optimal performance and the cost of the IC.

The voltage fluctuation rising edge detection circuit provided by the present disclosure can be used in an AC-DC controller. The voltage fluctuation rising edge detection circuit can detect whether the operating current of the AC-DC controller is AC or DC, thereby expanding the operating current of the AC-DC controller from DC to DC and AC.

The basic concepts are described above, and those skilled in the art may better understand, after reading this detailed disclosure, that the above detailed disclosure is intended to be presented by way of example only and not limitation. Although it is not explicitly stated herein, those skilled in the art may make various changes, improvements and modifications to the present disclosure. For example, the steps in the method of the present disclosure may not necessarily be performed in exactly the order described. These steps may also be performed in part and/or in other combinations as reasonably expected by those of ordinary skill in the art. These changes, improvements and modifications are intended to be included in the present disclosure, and fall within the scope of the embodiments of the present disclosure.

In addition, some terms are used to describe the embodiments of the present disclosure. For example, the terms "an embodiment", "one embodiment" and/or "some exemplary embodiments" mean that a particular feature, structure or characteristic described in the embodiment(s) is included in at least one embodiment of the present disclosure. Therefore, it should be emphasized and understood that two or more references to "an embodiment", "one embodiment" or "an alternative embodiment" in various parts of this disclosure may not necessarily all refer to the same embodiment. In addition, the specific features, structures or characteristics may be appropriately combined in one or more embodiments of the present disclosure.

In addition, those skilled in the art should understand that the aspects of the present disclosure may be described herein in either form of many patentable categories or contexts. These categories and contexts include any new and useful processes, machines, manufacturing or composition issues, or any new and useful improvements. Correspondingly, various aspects of the present disclosure may be fully implemented in hardware or software (including firmware, resident software, microcode, etc.). Alternatively, the software and hardware implementations may be combined, and all of them are generally referred to herein as "blocks", "modules", "engines", "units", "components" or "systems". In addition, the aspects of the present disclosure may take the form of a computer program product embodied in one or more computer-readable media on which computer-readable program codes are present.

Further, the stated order of processing elements or sequences, and the numbers, letters or other names used accordingly, are not intended to limit the claimed processes and methods to any order, unless it is defined in the claims. Although various embodiments have been discussed above through various embodiments that are currently considered to be useful embodiments of the present disclosure, it should be understood that such details are only for such a purpose. The appended claims are not limited to the disclosed embodiments, and on the contrary, they are intended to cover modifications and equivalent arrangements made within the scope of the disclosed embodiments. For example, although the implementation of the various components described above can be embodied in a hardware device, it can also be implemented as a software-only solution, for example, an installation on an existing server or mobile device.

Similarly, it should be understood that in the above description of the exemplary embodiments of the present disclosure, various features are sometimes combined in a single embodiment, drawing or description thereof to simplify the present disclosure and make one or more of the various creative embodiments better understood. However, the method of the present disclosure should not be interpreted as reflecting an intention that the claimed subject matter requires more features than those explicitly recited in each claim. In contrast, an inventive embodiment may have fewer features than all the features of a single previously disclosed exemplary embodiment.

What is claimed is:

1. A voltage fluctuation detection circuit, comprising:
    a voltage adjustment circuit, including:
        an adjustment circuit input terminal to receive an operating voltage,
        a first adjustment circuit output terminal to output a first voltage,
        a second adjustment circuit output terminal to output a second voltage that is step-shaped, and
        a voltage bias circuit, configured to add the bias voltage to an input voltage of the voltage bias circuit, wherein
        the second voltage differs from the first voltage by a bias voltage at the beginning of a preset clock period and falls within a first amplitude within the preset clock period, and a magnitude of the bias voltage is related to the operating voltage;
    a peak latch circuit, wherein
        a terminal of the peak latch circuit is connected to the comparator output terminal, another terminal of the peak latch circuit is connected to the voltage bias circuit, and the peak latch circuit latches peak data and transfers the peak data to the voltage bias circuit to enable the voltage bias circuit to adjust the bias voltage based on the peak data; and
    a comparator, including:
        a first comparator input terminal to receive the first voltage,
        a second comparator input terminal to receive the second voltage, and
        a comparator output terminal to output a comparison result of the first voltage and the second voltage.

2. The voltage fluctuation detection circuit according to claim 1, wherein the magnitude of the bias voltage is positively correlated with a peak of the operating voltage.

3. The voltage fluctuation detection circuit according to claim 1, wherein
    the first voltage is lower than the second voltage at the beginning of the preset clock period; and
    in the preset clock period, when an increase of the first voltage exceeds the bias voltage value, an output of the comparator is flipped between high and low levels at least once.

4. The voltage fluctuation detection circuit according to claim 1, wherein
    the first voltage is higher than the second voltage at the beginning of the preset clock period; and
    in the preset clock period, when a decrease of the first voltage exceeds the bias voltage value, an output of the comparator is flipped between high and low levels at least once.

5. The voltage fluctuation detection circuit according to claim 1, wherein the voltage adjustment circuit further includes:
    a step voltage generating circuit, configured to convert a voltage input to the step voltage generating circuit into a step voltage.

6. The voltage fluctuation detection circuit according to claim 5, wherein the step voltage generating circuit includes:
    a switch circuit;
    a clock circuit, connected to the switch circuit and controlling the switch circuit to be disconnected or connected according to the preset clock period to generate the second voltage; and
    a voltage holding circuit, connected to the switch circuit and holding the second voltage after the switch circuit is disconnected, such that the second voltage does not drop by more than a first voltage drop in the preset clock period.

7. The voltage fluctuation detection circuit according to claim 6, wherein
    the voltage bias circuit includes at least one of a voltage-controlled current source, or a voltage-controlled voltage source;
    the switch circuit includes at least one field-effect transistor (FET); and
    the voltage holding circuit includes at least one capacitor.

8. The voltage fluctuation detection circuit according to claim 5, wherein
    the first adjustment circuit output terminal is electrically connected to the adjustment circuit input terminal; and
    the voltage bias circuit is connected in series with the step voltage generating circuit, and the circuits in series are respectively connected to the adjustment circuit input terminal and the second adjustment circuit output terminal.

9. The voltage fluctuation detection circuit according to claim 8, wherein
    the first comparator input terminal is a positive terminal of the comparator, the second comparator input terminal is a negative terminal of the comparator, and the bias voltage is a positive voltage; or
    the first comparator input terminal is a negative terminal of the comparator, the second comparator input terminal is a positive terminal of the comparator, and the bias voltage is a positive voltage.

10. The voltage fluctuation detection circuit according to claim 5, wherein
the voltage bias circuit is connected in series with the first adjustment circuit output terminal and the adjustment circuit input terminal; and
the step voltage generating circuit is connected in series with the adjustment circuit input terminal and the second adjustment circuit output terminal.

11. The voltage fluctuation detection circuit according to claim 10, wherein
the first comparator input terminal is a positive terminal of the comparator, the second comparator input terminal is a negative terminal of the comparator, and the bias voltage is a negative voltage; or
the first comparator input terminal is a negative terminal of the comparator, the second comparator input terminal is a positive terminal of the comparator, and the bias voltage is a negative voltage.

12. The voltage fluctuation detection circuit according to claim 5, further comprising:
a voltage divider circuit,
wherein
a terminal of the voltage divider circuit is connected to an input voltage, another terminal of the voltage divider circuit is connected to a ground wire, and the voltage divider circuit divides the input voltage into the operating voltage to be output.

* * * * *